United States Patent
Singh et al.

(10) Patent No.: US 10,711,141 B1
(45) Date of Patent: Jul. 14, 2020

(54) NICKEL FREE CONDUCTIVE FILLER

(71) Applicant: Triton Systems, Inc., Chelmsford, MA (US)

(72) Inventors: Anant K. Singh, Woburn, MA (US); Peter S. Schuler, Westwood, MA (US)

(73) Assignee: TRITON SYSTEMS, INC., Chelmsford, MA (US)

(*) Notice: Subject to any disclaimer, the term of this patent is extended or adjusted under 35 U.S.C. 154(b) by 0 days.

(21) Appl. No.: 15/724,709

(22) Filed: Oct. 4, 2017

Related U.S. Application Data

(60) Provisional application No. 62/404,056, filed on Oct. 4, 2016.

(51) Int. Cl.
- *C09C 3/06* (2006.01)
- *C09D 5/24* (2006.01)
- *C09C 1/46* (2006.01)
- *C08K 3/04* (2006.01)
- *C08K 9/02* (2006.01)

(52) U.S. Cl.
CPC ............... *C09C 3/066* (2013.01); *C08K 3/04* (2013.01); *C08K 9/02* (2013.01); *C09C 1/46* (2013.01); *C09D 5/24* (2013.01); *C01P 2004/51* (2013.01); *C01P 2006/10* (2013.01); *C01P 2006/12* (2013.01)

(58) Field of Classification Search
CPC ....... C08G 18/673; B22F 1/025; H01C 7/105; C08K 3/08; H01B 1/24; H01B 1/22
USPC .......... 136/256; 361/760; 429/523; 523/209; 252/500; 524/404
See application file for complete search history.

(56) References Cited

U.S. PATENT DOCUMENTS

| | | | |
|---|---|---|---|
| 4,022,585 A | 5/1977 | Kaye | |
| 4,668,578 A | 5/1987 | Luxon | |
| 4,788,084 A | 11/1988 | Morin | |
| 6,642,297 B1 * | 11/2003 | Hyatt | H01C 7/105 523/209 |
| 2007/0012900 A1 * | 1/2007 | Callen | H01B 1/24 252/500 |
| 2009/0117268 A1 | 5/2009 | Lewis et al. | |
| 2009/0177268 A1 | 7/2009 | Lundkvist et al. | |
| 2010/0304063 A1 | 12/2010 | McCrea et al. | |
| 2011/0040007 A1 * | 2/2011 | Chandrasekhar | H01B 1/22 524/404 |
| 2012/0276332 A1 | 11/2012 | Conolly et al. | |
| 2014/0272170 A1 | 9/2014 | Hales et al. | |
| 2014/0332071 A1 * | 11/2014 | Jiang | C08G 18/673 136/256 |
| 2015/0037711 A1 * | 2/2015 | Cho | B22F 1/025 429/523 |
| 2015/0315437 A1 * | 11/2015 | Albaugh | C08K 3/08 361/760 |

FOREIGN PATENT DOCUMENTS

| | | | | |
|---|---|---|---|---|
| JP | 2002-020851 | * | 1/2002 | ............. C03B 40/02 |
| WO | WO 2008/072239 A2 | * | 6/2008 | ............. B01J 13/14 |

* cited by examiner

*Primary Examiner* — Khanh T Nguyen
(74) *Attorney, Agent, or Firm* — Pepper Hamilton LLP

(57) ABSTRACT

An electrically conductive filler comprises particles having a base substrate and a conductive coating. In some embodiments, the base substrate is a metal, plastic, glass, natural or synthetic graphite, carbon, ceramics, fiber or fabric. In some embodiments, the coating provides improved electrical conductivity, and the coated particle has lower electrical resistance than the uncoated base particle. Other embodiments and methods of making and using the electrically conductive filler are also disclosed.

12 Claims, No Drawings

NICKEL FREE CONDUCTIVE FILLER

This application claims priority to U.S. Provisional Patent Application No. 62/404,056 by Anant K. Singh and Peter Schuler which was filed on Oct. 4, 2016 and the entirety of which is hereby incorporated by reference.

The invention was developed with partial funding from the U.S. Government under Contracts FA8650-07-M-5026, FA8650-08-C-5600, N68335-12-C-0159, and FA8650-12-C-5198.

BACKGROUND

Modern fighter aircraft use conductive filled polymer resins on the Outer Mold Line (OML) surface to address electromagnetic interference (EMI), facilitate electrostatic discharge (ESD), and to help control critical survivability characteristics of the vehicle. In order to achieve the necessary properties for this class of materials, nickel is used due to its conductivity, environmental stability, and low cost.

In order to meet the Occupational Safety and Health Administration (OSHA) permissible exposure limit (PEL) for nickel, factory personnel utilize personal protective equipment (PPE), specialized finishing equipment, and specialized facilities that can store and properly dispose of nickel containing waste. All nickel-containing conductive materials have an exposure risk and require proper handling and procedures to ensure factory worker and maintainer safety. The known health risks associated with nickel are nickel dermatitis and nickel sensitization. Approximately 20% of the population has nickel allergies that will result in nickel dermatitis and prolonged exposure to nickel can result in nickel sensitization among those who do not have nickel allergies. Additionally, metallic nickel is reasonably anticipated to be a human carcinogen per the Twelfth Report on Carcinogens (2011). The Occupational and Safety Health Administration has set the permissible exposure limit (PEL) at 1 mg/m$^3$ time weighted average (TWA) or an 8 hour work day during a 40 hour work week. The National Institute for Occupational Safety and Health (NIOSH) has set the recommended exposure limit (REL) at 0.015 mg/m$^3$ TWA.

SUMMARY

Some embodiments provide an electrically conductive filler that comprises particles having a base substrate and a conductive coating. In some embodiments, the base substrate comprises a metal, plastic, glass, natural or synthetic graphite, carbon, ceramics, fiber or fabric. In some embodiments, the coating provides improved electrical conductivity, and the coated particle has lower electrical resistance than the uncoated base particle. In some embodiments, the substrate coating provides electrical conductivity and corrosion resistance. In some embodiments, the base substrate is coated with two or more layers of the same or different coating materials in various thicknesses to create various combination of properties. In some embodiments, the particles have a spherical, flat, round, cylindrical, or irregular shape. In some embodiments, the base substrate has a true particle density of 2.0 g/cc to 6.0 g/cc. In some embodiments, the base substrate has a particle size distribution of 5-500 microns. In some embodiments, the base substrate has a surface area of 0.2 m$^2$/g to 1.5 m$^2$/g. In some embodiments, the base substrate is calcined petroleum coke and the coating is tungsten.

Some embodiments provide a composition comprising a polymer and a filler as described above. In some embodiments, the filler that is loaded into the polymer at 30-45% by volume. In some embodiments, the composition has a Delcom resistivity of <1 ohms/sq. In some embodiments, the conductive coating is selected from the group consisting of tungsten, titanium, copper, gold, platinum, molybdenum, palladium, and alloys and combinations thereof In some embodiments, the coating is deposited onto the base substrate using a Physical Vapor Deposition process. In some embodiments, the base substrate has a particle size distribution of 50-250 microns. In some embodiments, the base substrate has a size distribution of D10 of 50-90 microns, D50 of 100-150 microns, and D90 of 100-200 microns. In some embodiments, the filler has a surface area of 0.4 m$^2$/g to 0.8 m$^2$/g.

DETAILED DESCRIPTION

Specialized fillers are needed to provide electrical conductivity to adhesives and sealants used on the surfaces of aircraft. Without these conductive fillers, the adhesive and sealants do not have the needed electrical properties because they are inherently insulating materials. The most important characteristic of the conductive filler is to provide capability of the resin to match the electrical resistance of the surrounding surface of the aircraft. The resin is used to fill gaps, surfaces, fasteners, and various defects and to provide a smooth surface throughout the entire outside surface of the aircraft. The combination of a smooth surface and a uniform conductive footprint provides key aircraft survivability characteristics. The fillers described in the invention must maintain high electrical conductivity and corrosion resistance in salt fog, acidic environments, and exposure to a wide variety of fluids and temperature fluctuations. The conductive fillers must not degrade electrically as a result of these environmental exposures in order to maintain key survivability characteristics. The specialized fillers should also be compatible with the currently used and other polymer resins and meet the physical and mechanical property requirements of the filler/resin mixed system.

The filler of the present invention provides high electrical conductivity and eliminates the use of nickel, which has health and safety concerns described above. The conductivity of the filler is provided by coatings that are deposited onto a base substrate using a physical vapor deposition process that provides for the use of coating materials that have not previously been possible to use. The coating on the filler is both conductive and corrosion resistant and can provide both functionalities with a single material. The filler of the present invention is compatible with currently used polymer resins and meets the physical and mechanical requirements of the mixed filler/resin system.

This invention is not limited to the particular compositions or methodologies described, as these may vary. In addition, the terminology used in the description describes particular versions or embodiments only and is not intended to limit the scope of the invention. Unless defined otherwise, all technical and scientific terms used herein have the same meanings as commonly understood by one of ordinary skill in the art. In case of conflict, the patent specification, including definitions, will prevail.

As used herein, the singular forms "a", "an" and "the" include plural reference unless the context clearly dictates otherwise.

As used herein, the term "about" means plus or minus 10% of the numerical value of the number with which it is being used. Therefore, about 50% means in the range of 40%-60%.

The terms "include", "comprise" and "have" and their conjugates, as used herein, mean "including but not necessarily limited to."

"Optional" or "optionally" may be taken to mean that the subsequently described structure, event or circumstance may or may not occur, and that the description includes instances where the event occurs and instances where it does not.

This application is also related to U.S. patent application Ser. No. 15/724,935 entitled NICKEL-FREE METALIZED FIBER MAT AND METHODS RELATED THERETO by inventors Anant Singh and Peter Schuler filed concurrently herewith on Oct. 4, 2017 and is hereby incorporated by reference in its entirety.

Various embodiments are directed to fillers including base substrate and coating deposited on base substrate. Further embodiments are directed to filled resins such as caulks and other materials containing such fillers, and devices containing such filled resins. Still other embodiments are directed to methods for making the fillers, and caulks and other materials containing the filler.

The fillers of various embodiments may contain a base substrate composed of a solid conductive material or solid non-conductive material. For example, in some embodiments, the base substrate may be composed of materials including, but are not limited to, glass, plastic, ceramic, graphite, carbon, metal, metal alloys, and the like and combinations thereof. Such base substrate may have any shape. For example, in some embodiments, base substrate may be particles having a spherical, flat, round, cylindrical, irregular shape, or combinations thereof. In other embodiments, the base substrate may be fibers, mats, or veils of such materials. In certain embodiments, fillers having a base substrate of graphite or carbon may have a fixed carbon content of about 97% to about 99.5%. For example, in particular embodiments, graphite base substrates may be composed of calcined petroleum coke. Calcined petroleum coke (CPC) is manufactured by heating green coke to approximately 1300° C. to 1400° C. in a rotary kiln. This removes residual hydrocarbons and moisture, resulting in a final calcined product containing trace amounts of volatile matter, for example, about 0.3% to about 6% sulfur.

The base substrate can be coated with a conductive coating material such as, for example, tungsten, titanium, copper, gold, platinum, molybdenum, palladium, and the like and alloys and combinations thereof. In various embodiments, the coating may cover about 80% to about 100% of a total surface area of the base substrate. Uncoated or partially uncoated base substrate can provide areas of higher electrical resistance due to the lack of the conductive coating. As a result of uncoated or partially uncoated base substrate, more filler must be added to a resin to overcome higher resistance particles. Fillers having greater than 80%, greater than 90%, greater than 95%, greater than 97%, greater than 98%, or greater than 99% of a total surface area coated with the coating material may drive the electrical conductivity in the filled resin as high as possible.

In some embodiments, the base substrate may be coated with two or more layers of the same or different coating materials in various thicknesses to create fillers with various combination of properties. For example, the base substrate may be first coated with a first metal or alloy that is electrically conductive and then coated with a second metal or alloy that is corrosion-resistant in order to create fillers that are both conductive and corrosion-resistant. As another example, the base substrate may be first coated with a first layer that improves adhesion and then coated with a second or more layers that provide electrically conductivity and additional properties. As another example, the base substrate may be coated with different layers of two or more metals or alloys to create fillers with gradient structures and properties to improve overall performance.

In some embodiments, the coated substrate may be composed of particles, and these particles may have a true particle density of about 2.0 g/cc to about 6.0 g/cc. In other embodiments, the coated particles may have a true particle density of about 2.5 g/cc to about 5.5 g/cc, about 3.0 g/cc to about 5.0 g/cc, about 3.5 g/cc to about 4.5 g/cc, or any individual density or range encompassed by these example values. In some embodiments, the coated particles may have a particle size distribution ranging from about 10 microns to about 500 microns or about 30 microns to about 200 microns, and in particular embodiments, the coated particles may have a D10 size distribution of about 50 microns to about 90 microns, a D50 size distribution of about 100 microns to 150 microns, and a D90 size distribution of about 130 microns to about 250 microns.

Further embodiments are directed to filled resins containing the fillers described above. Such filled resins therefore may contain a polymer resin and a filler composed of any of the base substrates described above coated with a conductive coating described above. The resin may be any resin known in the art for example, epoxy, silicone, polythio polymers (polythio ether polyether), polysulfide polymers, poly vinly chloride (PVC), natural or synthetic rubbers, polyethylene, polypropylene, polystyrene, acrylic resins, polyamides such as nylon, polycarbonates, polyurethanes, polyethylene terephthalate (PET), vinyl chloride resin, polyphenylene oxide, acrylonitrile butadiene styrene (ABS) resins, polyimide and the like.

The filler may be disposed within a resin, and in some embodiments, the filler may be substantially uniformly distributed within the resin. The filler may be loaded into the resin at about 25% to about 60% by volume, about 30% to about 50% by volume, about 35% to about 40% by volume, or any individual value or range encompassed by the example values. The filled resins encompassed by embodiments may have a surface resistivity of less than 2.0 ohms/square. For example, the filled resins may have a surface resistivity about 0.1 ohms/square to about 2.0 ohms/square, about 0.2 ohms/square to about 0.8 ohms/square, about 0.3 ohms/square to about 0.5 ohms/square, or any individual value or range encompassed by the example values.

The fillers of the present invention may have a surface area as measured by Brunauer-Emmett-Teller (BET) method that are between 0.2 $m^2/g$ to 2 $m^2/g$. For example, the surface area may be 0.3 $m^2/g$ to 1.5 $m^2/g$, about 0.4 $m^2/g$ to 0.8 $m^2/g$ or any individual value or range encompassed by the example values.

Additional embodiments are directed to devices containing the fillers described above or filled resins described above containing such fillers. Such devices include various electrical devices and antennae, and in certain embodiments, the filled resins may be used in devices for the aeronautical industry including aircraft and part of aircraft.

Other embodiments are directed to methods for making coated substrates by depositing a conductive coating onto a base substrate. In some embodiments, the step of depositing can be carried out using physical vapor deposition that is designed to coat small particles of various geometries. The physical vapor deposition process may be well suited for depositing various conductive or non-conductive materials onto a variety of substrates including, for example, conductive and corrosion resistant materials that might not be possible using a chemical vapor deposition or electroplating processes, and/or may be limited to a narrow range of specific materials and/or may not yield high performance defect-free coatings. In particular, physical vapor deposition may allow for depositing of metals such as, for example, tungsten, titanium, or molybdenum onto base substrates that otherwise would not be possible using plating methods. In some embodiments, the coating deposition may be carried out under vacuum. In further embodiments, the deposition chamber, a cathode, and target may be designed to promote uniform material deposition, a proper inert gas flow in the chamber, and optimum distance between the target and the coating surface. In such embodiments, depositing may be carried out directly onto the substrate of interest at an atomic level, producing high quality, defect free coatings with almost no waste.

The benefit of the filler described in this invention compared to uncoated graphite or nickel coated graphite is shown below in the following examples because it achieved significantly higher conductivity when produced by the same process at equivalent loading levels.

Example 1

Uncoated graphite (Product #3610—Asbury Carbons) is incorporated into a two-minute epoxy resin (Parabond 5105—Parson Adhesives) using a THINKY Model AR-100 Planetary Centrifugal Mixer. A 31% volume loading level of filler is used in the formulation. The mixture is rotated at 2000 RPM for 60 secs in the mixing mode followed by rotation at 2200 RPM for 30 secs in the aeration mode. The mixed resin is pressed to a thickness of 0.030" and cured overnight. A surface resistance of 36 ohms/square is measured using a Delcom Instruments 737B Conductance monitor.

Example 2

75% Nickel coated graphite (Novamet Specialty Products Corp) is incorporated into a two-minute epoxy resin (Parabond 5105—Parson Adhesives) using a THINKY Model AR-100 Planetary Centrifugal Mixer. A 31% volume loading level of filler is used in the formulation. The mixture is rotated at 2000 RPM for 60 secs in the mixing mode followed by rotation at 2200 RPM for 30 secs in the aeration mode. The mixed resin is pressed to a thickness of 0.030" and cured overnight. A surface resistance of 47 ohms/square is measured using a Delcom Instruments 737B Conductance monitor.

Example 3

Triton System graphite (Product P1122012-Triton Systems Inc) is incorporated into a two-minute epoxy resin (Parabond 5105—Parson Adhesives) using a THINKY Model AR-100 Planetary Centrifugal Mixer. A 31% volume loading level of filler is used in the formulation. The mixture is rotated at 2000 RPM for 60 secs in the mixing mode followed by rotation at 2200 RPM for 30 secs in the aeration mode. The mixed resin is pressed to a thickness of 0.030" and cured overnight. A surface resistance of 0.975 ohms/square is measured using a Delcom Instruments 737B Conductance monitor.

What is claimed is:

1. A composition comprising:
   an electrically conductive filler that comprises particles having a base substrate coated with a conductive coating; and
   a polymer,
   wherein the filler is loaded into the polymer at 25-60% by volume,
   wherein the composition has a Delcom resistivity of <1 ohms/sq, and
   wherein the base substrate is calcined petroleum coke and the conductive coating is tungsten.

2. The composition of claim 1, wherein the conductive coating provides improved electrical conductivity, and the particles have lower electrical resistance than the base substrate.

3. The composition of claim 1, wherein the conductive coating provides electrical conductivity and corrosion resistance.

4. The composition of claim 1, wherein the base substrate is coated with two or more layers of the same or different conductive coating materials in various thicknesses to create various combination of properties.

5. The composition of claim 1, wherein the particles have a spherical, flat, round, cylindrical, or irregular shape.

6. The composition of claim 1, wherein the base substrate has a true particle density of 2.0 g/cc to 6.0 g/cc.

7. The composition of claim 1, wherein the base substrate has a particle size distribution of 5-500 microns.

8. The composition of claim 1, wherein the base substrate has a surface area of 0.2 $m^2$/g to 1.5 $m^2$/g.

9. The composition of claim 1, wherein the conductive coating is deposited onto the base substrate using a Physical Vapor Deposition process.

10. The composition of claim 1, wherein the base substrate has a particle size distribution of 50-250 microns.

11. The composition of claim 1, wherein the base substrate has a size distribution of D10 of 50-90 microns, D50 of 100-150 microns, and D90 of 100-200 microns.

12. The composition of claim 1, wherein the filler has a surface area of 0.4 $m^2$/g to 0.8 $m^2$/g.

* * * * *